(12) United States Patent
Eastham

(10) Patent No.: US 6,696,107 B2
(45) Date of Patent: Feb. 24, 2004

(54) NANOSTRUCTURES

(75) Inventor: Derek A. Eastham, Chester (GB)

(73) Assignee: Council for the Central Laboratory of the Research Councils, Warrington (GB)

( * ) Notice: Subject to any disclaimer, the term of this patent is extended or adjusted under 35 U.S.C. 154(b) by 0 days.

(21) Appl. No.: 10/332,654

(22) PCT Filed: Mar. 26, 2001

(86) PCT No.: PCT/GB01/01300

§ 371 (c)(1),
(2), (4) Date: May 5, 2003

(87) PCT Pub. No.: WO02/05299

PCT Pub. Date: Jan. 17, 2002

(65) Prior Publication Data

US 2003/0170383 A1 Sep. 11, 2003

(30) Foreign Application Priority Data

Jul. 10, 2000 (GB) .............................................. 0016844

(51) Int. Cl.⁷ ................................................. H01F 1/00
(52) U.S. Cl. .................. 427/550; 204/192.32; 427/197; 427/212; 427/255.26; 427/255.4; 427/275; 427/307; 427/331; 427/399; 427/404; 427/555; 427/598
(58) Field of Search ................................. 427/550, 555, 427/598, 197, 212, 255.26, 255.4, 275, 307, 331, 399, 404; 204/192.32

(56) References Cited

U.S. PATENT DOCUMENTS 5,360,764 A 11/1994 Celotta et al.

FOREIGN PATENT DOCUMENTS

EP 0 977 182 A2 2/2000

OTHER PUBLICATIONS

Eastham, D.A., "The Deposition of Metallic Clusters On Surfaces," (1995), J. Phys. D.: Appl. Phys., vol. 28, No. 10, pp. 2176–2180 (Oct. 14, 1995).

Primary Examiner—Bernard Pianalto
(74) Attorney, Agent, or Firm—Akin, Gump, Strauss, Hauer & Feld, LLP

(57) ABSTRACT

The present invention relates to a method for producing an ordered array of nanoparticles on a substrate surface and to a nanomaterial having such an ordered array of nanoparticles. Particularly, but not exclusively, the invention relates to the provision of an ordered array of magnetic nanocrystals on a substrate surface.

Although the present invention is not limited to the production of a magnetic array, one important object of the present invention is the production of a material suitable for use as an ultra high density magnetic data storage medium.

According to the present invention there is provided a method of producing a structure comprising a plurality of nanoparticles distributed across a surface of a substrate in a predetermined array, the method comprising the steps of:
  i) providing a substrate which has a passivated surface;
  ii) depositing nanoparticles on to said surface; and
  iii) displacing said particles over said surface to configure them in said predetermined array.

31 Claims, 3 Drawing Sheets

NANOSTRUCTURES

The present invention relates to a method and apparatus for producing an ordered array of nanoparticles on a substrate surface and to a nanomaterial having such an ordered array of nanoparticles. Particularly, but not exclusively, the invention relates to the provision of an ordered array of magnetic nanocrystals on a substrate surface.

Although the present invention is not limited to the production of a magnetic array, one important object of the present invention is the production of a material suitable for use as an ultra high density magnetic data storage medium.

According to the present invention there is provided a method of producing a structure comprising a plurality of nanoparticles distributed across a surface of a substrate in a predetermined array, the method comprising the steps of:
 i) providing a substrate which has a passivated surface;
 ii) depositing nanoparticles on to said surface; and
 iii) displacing said particles over said surface to configure them in said predetermined array.

The concept of a passivated surface is well known to those in the art. Essentially a passivated surface is one which has substantially no dangling bonds and thus will not form a bond with the nanoparticles deposited on the surface. Although there may still be van dea waal forces between the particles and the surface these will be insignificantly weak.

The substrate may be a passive material or may be a non-passive material in which case step (i) includes a preliminary step of passivating said surface.

Passivating surfaces is a well known procedure. Essentially, it comprises coating the surface with atoms which take up the available dangling bonds.

Said passivating step may comprise covering said surface with atoms of an element such as hydrogen, fluorine, chlorine or oxygen. Monovalent elements are preferred.

Preferably said nanoparticles are passivated. This prevents nanoparticles bonding to one another on the surface.

Preferably said nanoparticles are passivated by passing them through a chamber containing gaseous atoms of a suitable passivating element such that said nanoparticles are coated with said passivating atoms prior to being deposited on said surface. Gases of monovalent atoms are preferred, particularly hydrogen although other atoms, such as oxygen, may be used.

Alternatively the nanoparticles may be passivated by covering them with a passivating element after they are deposited on said surface prior to, or during, the displacing step (iii).

Preferably said substrate surface is provided with an array of predefined regions corresponding to said predetermined array and said step (iii) comprises displacing the nanoparticles so that they move into and are retained within said regions.

For instance the regions may be physical features such as pits or holes sized to receive and retain said nanoparticles. Alternatively the regions may be non-passivated regions which chemically bond to said nanoparticles.

Various methods suitable for displacing the nanoparticles into said regions are described further below.

Alternatively said displacing step (iii) comprises establishing a standing laser wave, or an array of standing waves, using a laser so as to produce low energy nodes at locations corresponding to said predetermined array, whereby said nanoparticles are displaced into regions of said surface coincident with said low energy nodes thereby adopting a configuration corresponding to said predetermined array.

Methods according to the present invention are particularly suited to the production of a structure comprising an array magnetic nanoparticles, such as clusters of ferromagnetic atoms (for example cobalt atoms), in a non-magnetic matrix. Such materials can be used as the basis of a ultra high density storage media.

Other features and advantages of the present invention will be apparent from the following description and the appended claims.

BRIEF DESCRIPTION OF THE DRAWING

Embodiments of the present invention will now be described, by way of example only, with reference to the accompanying drawings, in which:

Referring to FIG. 1, this illustrates a nanomaterial in accordance with the present invention comprising an ordered array of magnetic nanocrystals, i.e. clusters of cobalt ions 1, in a non-magnetic copper matrix 2 on a silicon oxide substrate 3. The cobalt clusters 1 are all regularly shaped (i.e. substantially spherical) and of a consistent selected size. Typically the selected size might be between 1 and 15 nm although for magnetic material designed for use at room temperatures the superparamagnetic limit imposes a practical limitation on the minimum size of the cobalt clusters of around 7–10 nm. The cobalt clusters have a regular spacing of the order of 20 nm. This material is thus suitable for use as a ultra high density magnetic data storage medium, each cobalt cluster being substantially magnetically de-coupled from its neighbors and capable of storing a single bit of digital information. With the material of the present invention a storage density of the order of 1 Terrabit per square inch is theoretically obtainable.

Figure 1:
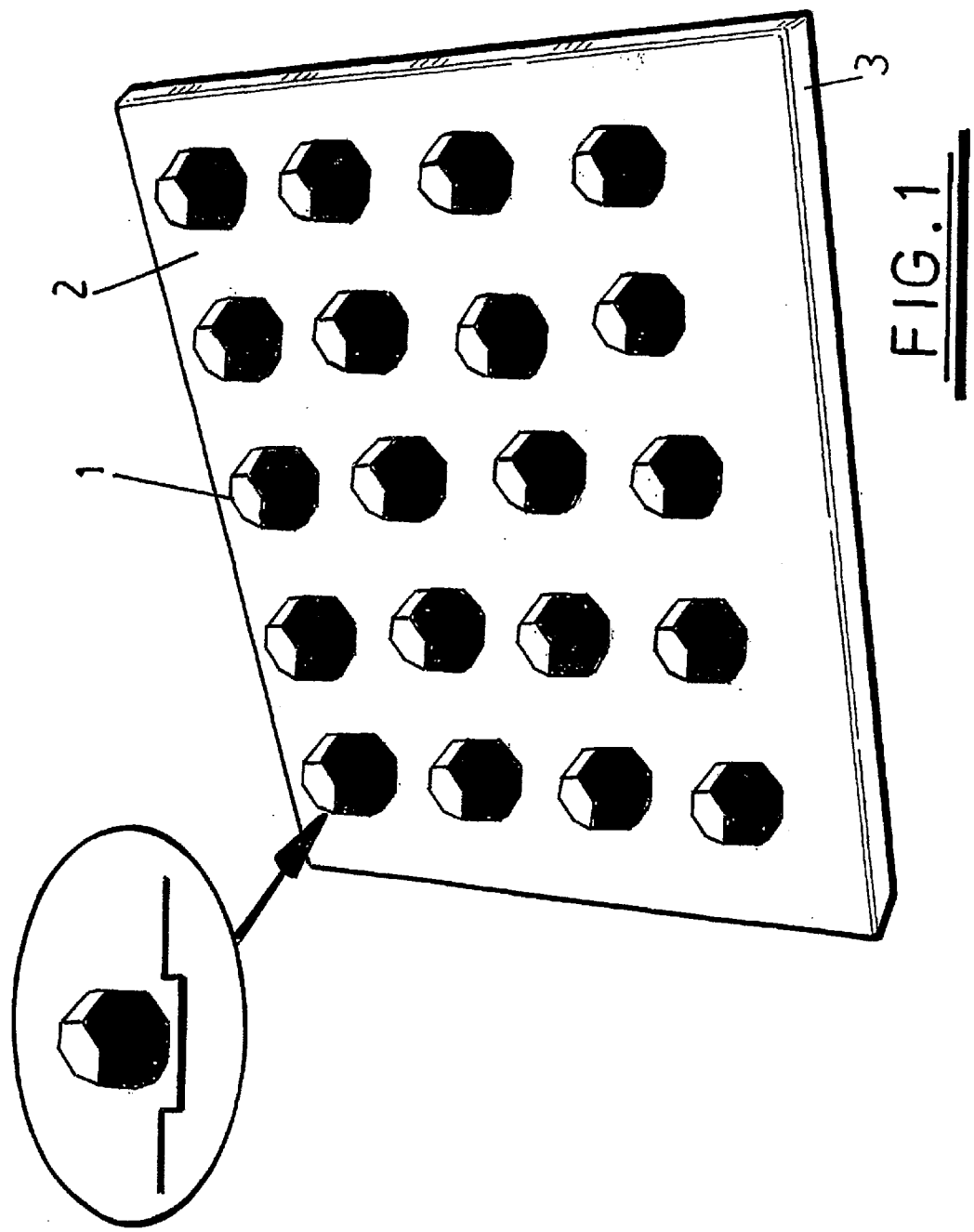
FIG. 1 is a schematic illustration of a material according to the present invention.
Figure 2:
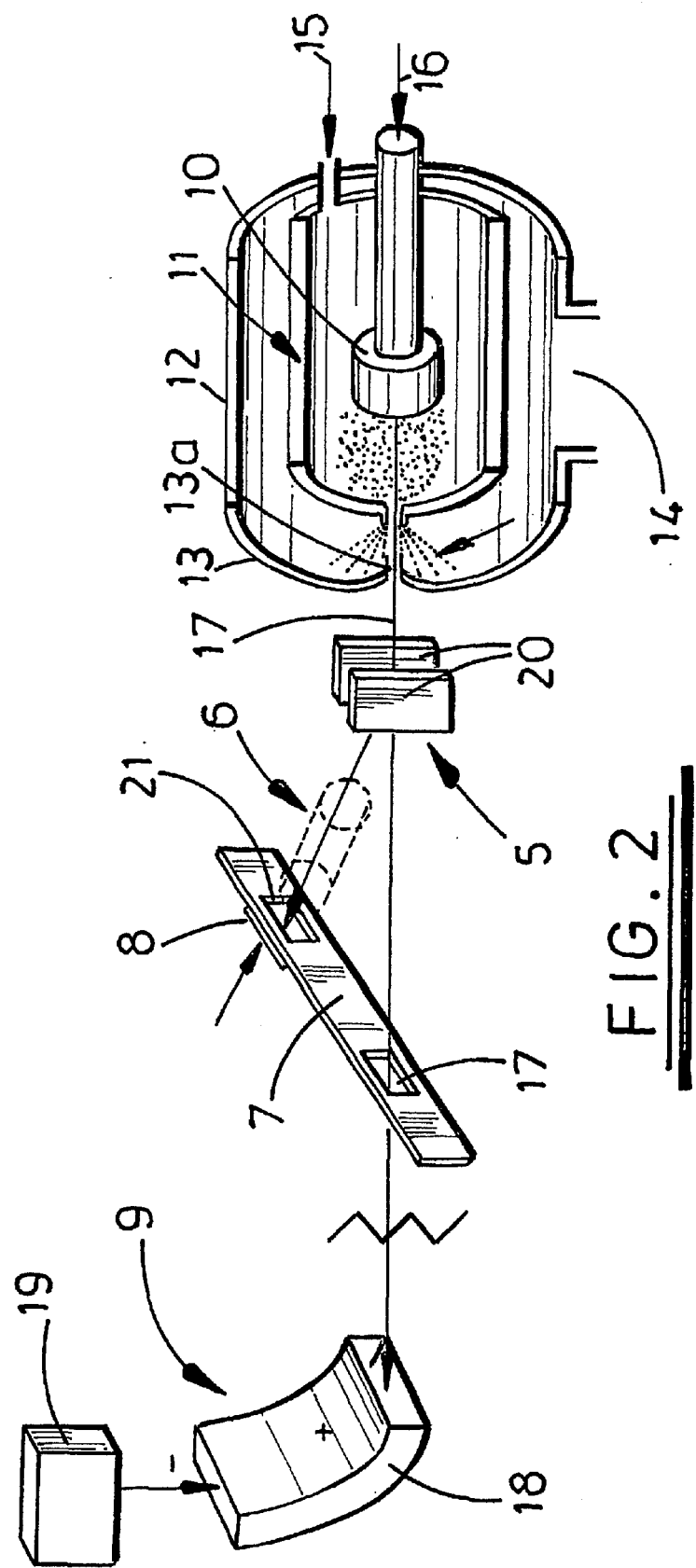
FIG. 2 is a schematic illustration of an apparatus for producing the material of FIG. 1 in accordance with the present invention.

One example of an apparatus for producing the ordered magnetic array of FIG. 1 will now be described with reference to FIG. 2. In overview, the apparatus of FIG. 2 comprises a means for producing cobalt clusters 4, a mass selector and steerer 5, an in-flight passivator 6, an aperture plate 7 supporting a sample substrate 8, and a "time of flight" measurement system 9. Other elements of the apparatus which are not illustrated will be described further below.

In accordance with the present invention the substrate must have a passivated surface. Thus, the substrate must either be fabricated from an inherently passive material, such as silicon oxide as in the present case, or must have its surface treated to passivate it. For instance, the surface of a silicon substrate could be passivated by spraying hydrogen atoms onto it in accordance with conventional semiconductor fabrication techniques.

In addition, in accordance with the particular example of the invention to be described, the surface must be provided with an array of pits or holes corresponding to the desired array of magnetic particles. Thus, in this example, the surface must be etched with a regular array conforming to the pattern illustrated in FIG. 1. The pits must be dimensioned appropriately to receive the selected cobalt cluster size in a manner described further below. For instance, for cobalt clusters of the order of 10 nm the appropriate pit dimensions would be a diameter of the order of 5 nm and the depth of the order of 1–3 nm. Given the small size of the pits, and also the close spacing of the pits required to produce the dense array, the preferred method of etching the pits is electron beam nanolithography. This is a known technique and so will not be described further.

The means for producing cobalt clusters 4 (i.e. the magnetic nanocrystals) comprises a magnetron 10 housed within a liquid nitrogen cooled chamber 11 which is itself housed within a second, larger, chamber 12. The chamber 12 supports at one end a skimmer 13 with a funnelled opening 13a and is connected to a vacuum pump (not shown) via port 14. With the exception of the opening 13a, the chamber 12 is sealed so that a reduced pressure may be maintained within the chambers 12 and 11 by operation of the vacuum pump.

Within the magnetron 10 is a cathode plate bearing cobalt (not shown) surrounded by suitably located anodes (not shown). An electric field is established between the cathode plate and the anodes, and a magnet (not shown) is positioned behind the cathode plate to produce a magnetic field in front of the plate.

Helium is supplied to the chamber 11 via inlet 15 and is maintained at a pressure of the order of 1τ by the vacuum pump. Low pressure argon gas is introduced into the magnetron 10 in a continuous stream 16 and is ionised by the electric field established between the cobalt bearing cathode plate and the anodes. Electrons which are separated from the argon atoms strike the cathode plate thereby liberating cobalt atoms.

Within the cooled chamber 11 the cobalt atoms have a limited mobility due to the presence of the gaseous helium atoms and thus tend to drift and stick together by a process of gas aggregation thereby forming various sized clusters or nanocrystals. These cobalt clusters pass from the cooled chamber 11 into the chamber 12 in a stream of helium and argon. Within the chamber 12 the helium rapidly expands and is skimmed off by the skimmer 13 leaving the cobalt clusters to be ejected through the skimmer aperture 13a in a supersonic jet of argon 17.

The jet 17 is directed toward the steerer 5 and time of flight measurement system 9 a such that with the steerer inoperative the cobalt clusters will travel to the time of flight and energy measurement system 9 via an aperture 17 in the aperture plate 7. The time of flight measurement system 9 essentially comprises an electrostatic energy selector 18 and a cobalt cluster detector 19. The time of flight measurement system 9 is a conventional system for determining the mass verses energy distribution of the cobalt clusters and thus further details of operation of this system will not be described here.

Periodic measurements made by the time of flight measurement system 9 are used to control operation of the mass selector and steerer 5 which in this example is a simple electrostatic stearer comprising two electrostatic plates 20. When a voltage is applied across the plates 20 negatively charged cobalt clusters (which represent about 30% of the clusters produced by the magnetron 10) will be deflected through an angle depending upon their mass and energy. The voltage across the plates can be carefully controlled (as a result of the measurements periodically made at the time of flight measurement system 9 by pulsing off the voltage applied across the electrostatic plates) to steer clusters of a selected mass towards the sample substrate 8 positioned behind an aperture 21 in the aperture plate 7. By careful control only clusters within a few percent of the selected size will be directed towards the sample substrate 8.

Before reaching the substrate surface, the deflected cobalt clusters first pass through the line of flight passivator 6 and are then decelerated by a retarding electric field produced in the region of the sample surface by appropriate means (not shown). The passivator 6 essentially comprises a tube containing atomised hydrogen at a pressure of around 1τ. The atomised hydrogen is extremely reactive and thus bonds to the surface of the cobalt nanocrystals as they pass through the passivator 6 effectively occupying the sites of any "dangling bonds" on the cluster surface. The hydrogen thus coats and thereby passivates the surface of the clusters. Hydrogen is used as a passivating material because it is both sufficiently reactive and is also relatively easy to produce for instance by heating a tungsten filament. It will, however, be appreciated that other elements, such as oxygen, could equally be used.

On leaving the passivator 6, the cobalt clusters loose energy (a factor of 10 reduction in energy is appropriate) in the retarding electric field and are thus "soft" landed on the substrate surface which prevents both the clusters and surface from damage.

When the cobalt clusters are first deposited on the substrate surface they will assume a random array, some of the clusters falling within the pre-etched pits on the substrate surface, but the majority lying of the surface between those pits. However, because the surface is passivated clusters will not bond to the surface and thus clusters other than those which happen to fall within pits will be free to move across the substrate surface. Furthermore, passivation of individual cobalt clusters prevents individual clusters drifting towards and bonding with one another. Thus, in accordance with the next stage of the method according to the present invention the clusters may be moved over the substrate surface and into the pre-etched pits to form an ordered array. A variety of different techniques can be used to move the cobalt clusters and no one particular technique is illustrated in FIG. 2.

For instance, according to one preferred technique, a laser may be used to brush cobalt clusters across the substrate surface. That is, a suitable laser may be swept across the surface and controlled to produce a radiation pressure which is sufficient to brush cobalt clusters into the pits but not to dislodge cobalt clusters located within the pits.

As an alternative, the substrate and clusters could simply be heated so that the clusters become thermally agitated causing them to randomly migrate across the substrate surface so that they fall into the pits provided on the surface. The heating can be controlled so that individual clusters do not have sufficient thermal energy to escape the pits.

A further alternative applicable in the present example in which the nanocrystals are clusters of a magnetic material, is to use a magnetic field to sweep the cobalt clusters across the surface, again controlling the field to produce a force sufficient to brush cobalt clusters into the pits but not to dislodge cobalt clusters from the pits.

Whatever the displacing technique used, the result is that the cobalt clusters are moved into, and thus physically pinned within, the array of pits etched on the substrate surface thus forming a corresponding ordered array. As a final stage in the production of the material of FIG. 1, a layer of non-magnetic metal, in this case copper, is deposited on the surface which both fixes the clusters in position. The copper film may be deposited by any conventional process such as atomic deposition from a second magnetron or by chemical vapour deposition. The result is the new material which is illustrated in FIG. 1.

It will be appreciated that the final array is determined by the pattern originally etched into the substrate surface and that arrays quite different from that illustrated can be configured.

It will also be appreciated that whereas the above example of the invention exemplifies the use of the invention in producing a material suitably for use as a magnetic storage medium, alternative materials could be used for the substrate, the deposited nanocrystals and also any additional material which is deposited over the nanocrystals to fix them in place. For instance, the substrate could be a conducting, semi-conducting or insulating substrate of any material providing that the surface of the substrate can be passivated if it is not inherently passive. The nanocrystals can be of any appropriate substance, for instance a metal such as clusters of copper atoms may be used. The material deposited over the nanocrystals to fix them in position need not be a metal but could be any appropriate substance depending upon the intended application of the material. It is also conceivable that in some applications it will not be necessary to apply an additional layer to fix the nanocrystals in place.

The methods mentioned above for displacing the nanocrystals to form the ordered array are examples only and other methods may be envisaged. The particular method used may be determined as appropriate for the materials used for the substrate and nanocrystals. For instance, a magnetic brush could not be used in instances where the nanocrystals are non-magnetic.

Various modifications can be made to the apparatus and method described above in relation to FIG. 2. For instance, an alternative form of mass selector may be used, such as a quadrapole. If a quadrapole is used it may for instance be situated between the skimmer 13 and the steerer plates 20 which in such an arrangement will be required only to steer the clusters and will not perform any mass selection. Accordingly, it may be possible to dispense with the time of flight measurement system 9, although it is preferable to maintain this system to monitor the cluster production and to calibrate the quadrapole. Details of a quadrapole are well known in the art (for instance as used in mass spectrometers) and will not be described here. Similarly, other forms of mass or energy selector which could be used will be evident to the skilled person.

Figure 3:
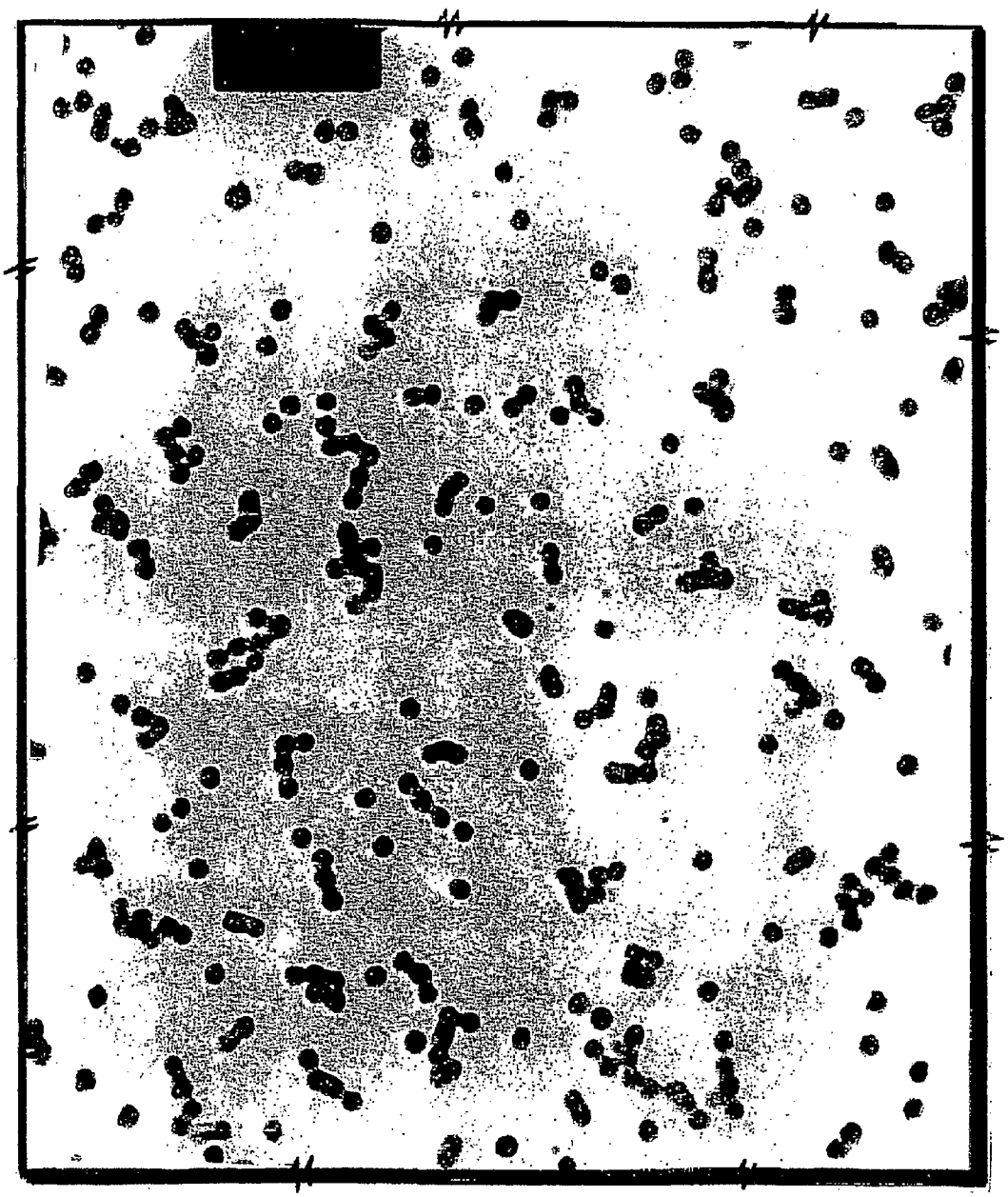
FIG. 3 is a photograph of a material which may be produced by the method and apparatus of the present invention.

As a further modification the in-flight passivator could be replaced by apparatus for passivating the clusters as they arrive at the substrate surface. For instance, an appropriate passivating material, such as hydrogen atoms, could be sprayed onto the surface as the clusters are deposited using known semi-conductor techniques. Moreover, for some applications it may not be necessary to passivate the clusters at all. However if the clusters are not passivated they may tend to drift together and form groups or strings as mentioned above. For instance, FIG. 3 illustrates mass selected clusters of cobalt deposited on a passive substrate surface (in this case carbon) without themselves being passivated. As is evident from the photograph, although the individual clusters are regularly sized and shaped many drift together forming strings. The formation of such strings would not be acceptable when attempting to produce the ordered array shown in FIG. 1 but for other structures it may be acceptable. Where a high degree of order is required as for the material of FIG. 1 the in-flight passivator is preferred to any surface passivation to prevent the possibility of clusters drifting together before they are passivated.

The magnetron device used to produce the cobalt clusters is the preferred method according to the present invention but the invention may be used to produce an ordered array of nanocrystals produced by any appropriate means.

In the examples of the invention described above, ordering of the nanocrystals into the desired array is achieved by displacing the nanocrystals once they have been deposited on the surface so that they fall into a pre-etched array of pits defined on the surface. As an alternative to physical pits or holes a substrate surface could be provided with an array of non-passivated regions corresponding to the desired array of nanoparticles. This will enable the nanoparticles, particularly in instances where the nanoparticles are not themselves passivated, to bond to the surface is desired positions.

A further alternative contemplated by the present invention is to use a standing wave generated by a coherent laser to order the nanocrystals. Standing waves have been used to produce three dimensional arrays of proteins in space for protein crystology. Particles within the array migrate to the low energy nodes of the standing waves and thus by controlling the wavelength and orientation of the standing waves a particular desired ordered array can be achieved. The same principle can be used to produce a two dimensional standing wave pattern across a substrate in accordance with the present invention. In this instance, the nanocrystals will migrate to the low energy nodes across the surface of the substrate. One potential disadvantage of this method is that the spacing of the nanocrystals is dependent upon the positioning of the low energy nodes which is dependent upon the wavelength of the laser. This imposes a practical limitation on the minimum spacing that can be achieved which, for instance, will be too large to be of practical use in a memory storage device but may well have applications elsewhere.

Other possible modifications of the above apparatus, and applications of the present invention, will be readily apparent to the appropriately skilled person. For instance, a structure comprising multiple layers of material as illustrated in FIG. 1 may be expected to have unusual electron transport properties.

What is claimed is:

1. A method of producing a structure comprising a plurality of nanoparticles distributed across a surface of a substrate in a predetermined array, the method comprising the steps of:
   i) providing a substrate which has a passivated surface;
   ii) depositing nanoparticles on to said surface; and
   iii) displacing said particles over said surface to configure them in said predetermined array.

2. A method according to claim 1, wherein said substrate is a passive material.

3. A method according to claim 1, wherein the substrate is non-passive and step (i) includes a preliminary step of passivating said surface.

4. A method according to claim 3, wherein said passivating step comprises covering said surface with atoms of an element such as hydrogen, fluorine, chlorine or oxygen.

5. A method according to claim 1, wherein said nanoparticles are passivated.

6. A method according to claim 5, wherein said nanoparticles are passivated by passing them through a chamber containing gaseous atoms of a suitable passivating element such as hydrogen or oxygen such that said nanoparticles are coated with said passivating atoms prior to being deposited on said surface.

7. A method according to claim 6, wherein said chamber comprises atomised hydrogen or oxygen at a pressure of about 1τ.

8. A method according to claim 5, wherein the nanoparticles are passivated by covering them with a passivating element after they are deposited on said surface prior to, or during, the displacing step (iii).

9. A method according to claim 1, wherein said substrate surface is provided with an array of predefined regions corresponding to said predetermined array and said step (iii) comprises displacing the nanoparticles so that they move into and are retained within said regions.

10. A method according to claim 9, wherein said regions are physical features such as pits or holes sized to receive and retain said nanoparticles.

11. A method according to claim 10, wherein said regions are formed by a lithographic process.

12. A method according to claim 9, wherein said regions are non-passivated regions which chemically bond to said nanoparticles.

13. A method according to claim 9, wherein said displacing step (iii) comprises applying a force across the surface of the substrate sufficient to move nanoparticles into said regions but not sufficient to dislodge said nanoparticles from said regions.

14. A method according to claim 13, wherein said force is radiation pressure produced by sweeping a laser across said surface.

15. A method according to claim 13, wherein said nanoparticles are magnetic and said force is produced by a magnetic field which is swept across said surface.

16. A method according to claim 9, wherein said displacing step (iii) comprises heating said nanoparticles to thermally agitate them so that they migrate into said regions.

17. A method according to claim 1, wherein said displacing step (iii) comprises establishing a standing laser wave, or an array of standing waves, using a laser so as to produce low energy nodes at locations corresponding to said predetermined array, whereby said nanoparticles are displaced into regions of said surface coincident with said low energy nodes thereby adopting a configuration corresponding to said predetermined array.

18. A method according to claim 1, wherein each nanoparticle is a nanocrystal comprising a cluster of atoms.

19. A method according to claim 18, wherein said clusters are produced by spluttering atoms from a surface within a magnetron and allowing the atoms to form clusters by a process of gas aggregation.

20. A method according to claim 19, wherein the gas aggregation takes place in a cooled chamber containing an inert gas such as helium.

21. A method according to claim 1, wherein the nanoparticles are deposited on said surface in a jet of an inert gas such as argon.

22. A method according to claim 1, wherein prior to depositing said nanoparticles on said surface said nanoparticles are passed through a mass selector so that only particles of a selected size or size range are deposited on said surface.

23. A method according to claim 1, wherein said nanoparticles have a diameter of the order of 1 to 15 nm.

24. A method according to claim 23, wherein said nanoparticles have a diameter between about 1 and 10 nm.

25. A method according to claim 1, wherein the nanoparticles are regularly shaped and generally spherical.

26. A method according to claim 1, wherein the nanoparticles are retarded in an electric field to reduce their energy immediately prior to deposition on said surface.

27. A method according to claim 1, wherein said particles are ferromagnetic.

28. A method according to claim 27, wherein said nanoparticles are clusters of cobalt atoms.

29. A method according to claim 1, wherein said predetermined array is a regular array of individual nanoparticles suitable for use as a magnetic storage media.

30. A method according to claim 1, wherein following displacing step (iii) a layer of material is formed over said surface and said array of nanoparticles which fixes said nanoparticles in position.

31. A method according to claim 30, wherein said layer is a non-magnetic material.

* * * * *